(12) United States Patent
Nims et al.

(10) Patent No.: US 6,709,080 B2
(45) Date of Patent: Mar. 23, 2004

(54) METHOD AND APPARATUS FOR DIRECT PRINTING ON A LENTICULAR FOIL

(75) Inventors: Jerry C. Nims, Atlanta, GA (US); Paul F. Peters, Suwanee, GA (US); William M. Karszes, Rosewell, GA (US); Guido DeSie, Mortsel (BE); Luc Vanmaele, Mortsel (BE)

(73) Assignee: Orasee Corp., Duluth, GA (US)

( * ) Notice: Subject to any disclaimer, the term of this patent is extended or adjusted under 35 U.S.C. 154(b) by 0 days.

(21) Appl. No.: 10/008,378

(22) Filed: Dec. 10, 2001

(65) Prior Publication Data

US 2002/0113829 A1 Aug. 22, 2002

Related U.S. Application Data

(60) Provisional application No. 60/251,876, filed on Dec. 8, 2000.

(51) Int. Cl.[7] .............................. B41J 3/407; B41J 3/00; B41J 2/01
(52) U.S. Cl. .................. 347/1; 347/5; 347/9; 347/2
(58) Field of Search ................ 347/171, 2, 1, 347/5, 9

(56) References Cited

U.S. PATENT DOCUMENTS 5,812,152 A     9/1998     Torigoe et al.
6,481,844 B1 * 11/2002     Beery .......................... 347/104

FOREIGN PATENT DOCUMENTS

JP     281327     10/1995
JP     192696     7/1999

* cited by examiner

*Primary Examiner*—Huan H. Tran
(74) *Attorney, Agent, or Firm*—Patton Boggs LLP

(57) ABSTRACT

One or more pixel images are stored in a programmable computer. A lenticular sheet having a plurality of lenticules is placed in an inkjet printer having a printhead and a light sensor. The light sensor scans across the lenticular sheet and generates a scan data. A lenticular data is calculated based on the scan data, the lenticular data representing the lenticule spacing or frequency. At least a portion of the pixel images are formatted with a pixel spacing based on the lenticular data and printed. The formatting aligns the pixels with the lenticules.

10 Claims, 3 Drawing Sheets

METHOD AND APPARATUS FOR DIRECT PRINTING ON A LENTICULAR FOIL

Priority of this application is based on U.S. Provisional Application No. 60/251,876, filed on Dec. 8, 2000, which is hereby incorporated by reference.

BACKGROUND OF THE INVENTION

1. Field of the Invention

The present invention relates to lenticular media and, more particularly, to a method and apparatus for fabricating lenticular sheets optimally matched to a particular printer's performance characteristics, and for controlling a printer to conform to particularities of and the orientation of the fabricated lenticular sheet.

2. Statement of the Problem

The use of lenticular sheets to transmit images to appear to an observer as three-dimensional, and to appear different from different viewer positions, to give a perception of changing as the observer moves, is known. A summary of certain typical features, and some general examples, are given for convenience.

A lenticular sheet, as it is generally known, includes a plurality of semi-cylindrical lenses, or lenticules, arranged side-by-side, in a plane, each extending in the same direction. The lenticular sheet is typically formed of a substantially transparent plastic and is overlaid onto an ink-supporting substrate or medium on which a plurality of specially formatted images are disposed.

If the lenticular sheet is to transmit images to appear three dimensional, the plurality of images disposed on the underlying medium includes one or more left images and, typically, a corresponding number of right images. Each left image and right image may be of the same scene or arrangement of objects, with the relative position of objects or portions of objects being different in one with respect to the other, to mimic the parallax between the images impinging on an observer's left eye versus that impinging on his or her right eye. It is known in the art of imaging that a person's perception of three dimensions, when viewing a real world scene, is caused, in significant part, by the parallax between the image seen by the person's left eye and that seen by the person's right eye. A typical camera does not capture this parallax, because it has only a single lens. Therefore, when a viewer looks at a photograph taken by a single-lens camera, his or her left eye and right eye see exactly the same image. There is no parallax conveyed. For this reason, a typical photograph does not convey a three-dimensional feel, and flattens the appearance of objects.

A lenticular sheet, though, permits display of an image on a hard copy surface to appear three-dimensional. One method for this displaying is to take a picture of a scene from a first location, and then move the camera a lateral distance to a second location and take a picture of the same scene. The picture taken from the first position may be called the left image and the picture taken from the second position may be called the right image. There is a parallax between the two images, due to the lateral displacement between the respective positions from which the left and right pictures were taken. The parallax is exploited by rasterizing the left and right images or pictures into, for example, sixty-four vertical strips each. The rasterizing can be done by converting the pictures into a digital pixel array and then dividing the array into sixty-four strips, typically in a vertical direction. The left and right images are disposed on a medium, typically by placing the first vertical stripe of the left image next to the first vertical stripe of the right image, and then the second vertical stripe of the left image next to the second vertical stripe of the right image. The arrangement is typically repeated so that, for example, the sixty-four vertical stripes of the left image are interspersed with sixty-four vertical stripes of the right image, in an alternating pattern.

A lenticular sheet having, for example, sixty-four lenticules is placed over the two interspersed rasterized images, such that each lenticule runs parallel to, and extends above, at least one left image raster line and one right image raster line. Because the left and right raster lines have different positions under the lenticules, the light from the left image raster line will have a different angle of refraction passing through the lenticule than does the light from the right image raster line. The different angles of refraction are such that a person's left eye, when at a specific viewing angle and distance with respect to the medium, will see only the left image raster lines and the person's right eye will see only the right image raster lines. The person's left eye and right eye receive different images, the difference between the two being the parallax that the person would have actually observed if looking at the original scene. The person thus "sees" a three dimensional image.

Typically, placing two raster lines under each lenticule limits the viewing positions from which an observer will see a three dimensional image. The reason is that to see three dimensions the viewer must be in the position where only the left image raster lines are refracted to the viewer's left eye, and only the right image raster line are refracted to the viewer's right eye. At other viewing positions the viewer's eyes each receive both the left image and right image raster lines, or both eyes receive only left image raster lines or right image raster lines, which presents as a two-dimensional image.

To increase the number of viewing positions from which the observer will see a three-dimensional image, a greater number of rasterized images are created, and a correspondingly greater number of raster lines are disposed under each lenticule. For example, instead of a left eye and right eye picture taken from a single head-on view, a plurality of left/right pictures can be taken, each from a different view. Picking three views as an example, the above-described head-on view is generated as described, and then a first flank view is generated by taking a left eye picture and a right eye picture, from a position to the left and right, respectively, of a second view position. The second view position may be displaced, for example, 10 degrees left from the head-on position. Next a right flank view is generated by taking a left picture and a right picture, from a position to the left and right, respectively, of a third view position. The third view position is displaced, for this example, 10 degrees to the right of the head-on position.

There are problems with the above-described multiple view method, though, arising from the requirement for more raster lines. For example, the three above-described views require six pictures or images, to be displayed through the lenticular sheet. For such display, each of the six images or pictures must be segmented or rasterized into, for example, sixty-four vertical strips. The sixty-four vertical strips of each picture or image would then be interleaved so that a total of 364 vertical strips, or raster lines, are disposed on the substrate. The lenticular sheet would then be overlaid such that each lenticule covers six vertical strips or raster lines, namely one from each of the left and right pictures taken from each of the three above-described viewing perspectives.

Due to the differing positions of each of the six raster lines under the lenticule, the light from each undergoes a different angle of refraction as it passes through the lenticule. Because of the raster lines from the different images being diffracted differently, there is typically one viewing position at which the observer sees a three-dimensional image of the above-described head-on view. Assuming the raster lines are disposed accurately with respect to the lenticules, there is a second viewing position at which the observer sees a three-dimensional image of the left flank view. Likewise, assuming the raster lines are disposed accurately with respect to the lenticules, there is a third viewing position at which the viewer will see a three-dimensional view from the right flank viewing angle.

There are problems with the multiple viewing angle method, namely that the method requires a greater number of pixel or raster lines. A related problem is that the method requires that the pixel or raster lines be disposed accurately with respect to the lenticules.

Lenticular sheets also allow observers to see images which change as the observer changes his or her position with respect to the medium. The principle of operation is the same as that used for presenting images appearing to be three-dimensional. An example is a first picture or image being of a golfer holding a club in the upswing position, and a second image being of the golfer in the downswing position. The two images or pictures are rasterized. The raster lines of the two images are disposed on a medium, typically in a manner alternating between a raster line from the first picture, i.e. The golfer in the upswing position, followed by a raster line from the second picture, i.e. The golfer in the downswing position. The pattern is continued such that the two rasterized images are interlaced with one another. Then, a lenticular sheet is typically overlaid such that each lenticule covers two raster lines—one raster line from the first picture and one raster line from the second picture.

Due to the different positions under the lenticule, the light from the raster line corresponding to the first picture or image is diffracted at an angle different than the light from the raster line of the second picture or image. The different diffraction angles are such that the observer from a first viewing position sees only the raster lines from one of the two pictures or images. However, when the observer is at a second position he or she sees only the raster lines from the other of the two pictures or images. Referring to the golf example, the observer would see the golfer in the upswing position from one viewing position but would see the downswing position from another viewing position.

The golfer example above used only two images. More than two images however, could be imaged, rasterized, disposed on a medium, and overlaid with a lenticular sheet. For example, a sequence of the golfer going through four positions can be displayed through a lenticular sheet as follows: First, the four positions would be photographed and rasterized. The four rasterized images would then be disposed on a printable medium or substrate. The arrangement would typically be the first raster line from each of the four pictures followed by the second raster line from each of the four pictures, and so on. A lenticular sheet would then be overlaid, typically such that each lenticule covered, for this example, four raster lines, one raster line from each of the four pictures. The location of each set of four raster lines under each lenticule is such that the observer sees only the raster lines from one of the four, depending on the viewing angle relative to the medium.

The above example of four positions of a golfer presents problems similar to the multiple three-dimensional images. Namely, the greater the number of images, whether the images are different views of the same scene or different positions or degrees of zoom for an object, the greater the number of pixel lines that are required. The general relation between image quality and the number of pixel or raster lines amplifies these problems. Stated differently, both the quality of an image and the number of images or views that can be seen though a lenticular sheet are determined, in significant part, by the number and spacing of the raster lines and by the number of lenticules or microlenses. However, for any given size of image an increase in the number of raster lines necessarily decreases the line width, or the width of each pixel making up the line if the image is pixel-based. The increase in the number of raster lines not only decreases the line or pixel width; it also decreases the spacing from one raster line or pixel to the next.

The present inventors have identified inkjet printers as a preferred apparatus for printing lines of pixels, or raster lines, for viewing through a lenticular sheet. However, inkjet printers have inherent limitations as to the minimum dot size they can print, and limitations on the minimum spacing from one dot to the next. The prior art selects line widths and spacing based on trial-and-error, or to match standard or vendor-supplied lenticular sheets. Prior art lenticular sheets, however, are manufactured without particular consideration to the specific printing capabilities of the printer, or of the type of printer, that will be used to print the interleaved pixel lines, i.e., raster lines, on the medium. The spacing between the lenticules or microlenses, though, is one of the ultimate factors bearing on the width of the pixel lines, and the number and spacing of pixel lines. More particularly, if the number of pixel lines is selected which results in a line, or pixel width, or pixel-to-pixel spacing smaller than the ink-jet printer can produce the image quality will be substantially degraded. On the other hand, if the number of pixel lines is selected based on an overly conservative estimate of the printer's capabilities, the final product will have an image quality that is lower than what could have been obtained.

The present inventors have identified a further problem with using inkjet printers to print on a lenticular sheet. The problem is that, due to human error, shortcomings in the printer feed mechanism, and other causes, the orientation of the lenticular sheet when the printing operation is performed may not be correct. As a result, as the lenticular sheet progresses through the printer there will be a migration in the position of the first lenticule in the direction of the printer carriage.

Still another problem identified by the present inventors is that regardless of the nominal spacing between lenticules, the raster image processing associated with an inkjet printer cannot space the pixels as correctly as attainable absent use of measured data representing the lenticule spacing of the lenticule sheet that is actually being printed on.

SUMMARY OF THE INVENTION

These problems, and others, are overcome, and additional benefits are provided by the methods and apparati according to the present invention.

A first aspect of the invention includes steps of providing a microlens or lenticular sheet having a plurality of microlenses or lenticules extending in a first direction with a spacing between lenticules and having an ink-receptive surface disposed on a surface of the lenticular sheet, and providing a digital image data processing apparatus having a data storage, a data input/output interface, and raster image processing ("RIP") software, and providing an inkjet printer having a print head moved in a carriage direction by a servo, a light sensor for receiving an ambient light passing through the lenticular sheet and for generating a sensor signal in response, and a transmitter for transmitting the sensor signal to the input/output interface of the digital image processing apparatus, and a servo for moving the sensor in the carriage direction. Next, a digital image file representing, in pixel form, an image for printing on the lenticular sheet is stored in the image data storage of the digital image processing apparatus. The lenticular sheet is then fed or placed into the inkjet printer such that the lenticules extend in a direction perpendicular to the carriage direction. Next a scan step moves the light sensor in the carriage direction to detect light through the lenticular sheet at a sequence of positions along the carriage direction and transmits corresponding sensor data to the digital image processing apparatus. The digital image processing apparatus then calculates a lenticule spacing data, representing an estimated value of the lenticule spacing, based on the sensor data transmitted by the scan step. Next an image modification step generates a re-spaced digital image file based on the digital image file and the lenticule spacing data. A printing step then prints an image on the lenticular sheet corresponding to the re-spaced digital image file.

Another aspect of this invention includes provides the lenticular sheet by first providing an inkjet printer with a digital signal interface for communicating with a programmable computer or other digital image data processing and having a storage apparatus, and having a movable print head controlled by a servo. Next a measuring step measures the smallest increment that the servo can move the movable print head and generates a Least Interval Value data representing the measurement. Next, the sheet is extruded with lenticules having a spacing based on the Least Interval Value data, and preferably having an ink-receptive surface.

BRIEF DESCRIPTION OF THE DRAWINGS

These and other objects of the invention will be clear upon a reading of the following detailed description of several preferred embodiments of the invention, together with the following drawings of which.

DETAILED DESCRIPTION OF THE INVENTION

1. Overview

To facilitate a ready understanding of the novel aspects of the present invention, this description omits a detailed discussion of the methods and processes by which pictures, or computer generated images, or combinations of both, are digitized and processed into the format required for viewing through a lenticular sheet. Many methods and techniques for such processing are known to persons of ordinary skill in the art of computer generated and enhanced graphics, particularly three-dimensional graphics. Common to substantially all of the known methods is that a plurality of two-dimensional pictures or images are digitized into a pixel array, and the array is segmented into strips of pixels. For purposes of this description, a strip of pixels will be referenced as a "raster line." It is known in the art that the raster lines are interleaved, using known data manipulation methods, and output to a printing apparatus. The novel aspects of the present invention relate to the spacing between the raster lines, the structure and spacing between the lenticules of the lenticular sheet, measuring the spacing between lenticules after the lenticular sheet is installed in the inkjet printer, modifying the pixel spacing based on the measured spacing, and a system integrating these novel features in a further unique combination.

Further, the present invention may be implemented upon reading this disclosure through ready modifications of existing inkjet printers and known methods for capturing pictures, digitizing and rasterizing the digital images, interleaving and formatting the rasterized images for output and printing. As will be understood, the readily performed modifications relate to calculating the pixel widths and raster line spacing in accordance with this description, inputting these values to a raster image processing ("RIP") software to format the image for transfer to an inkjet printer, and to installing commercially available light detection sensors on existing inkjet printer carriages.

2. Detailed Description
Printing Based on Measurement of Lenticule Spacing

An example of a first and a second method according to this invention will be described in reference to FIG. 1. For both of these examples, it is assumed that digital images, in any format convertible to a pixel representation, forming two "flip" positions of an object are input to a general purpose digital computer having raster image processing ("RIP") software. The two positions may be digital scans of pre-existing pictures. Alternatively, a single image is input and the "flip" position image is generated within the computer using, for example, commercially available "morphing" software. The two "flip" images are then rasterized into pixel lines, or strips, or raster lines (not shown).

Figure 1:
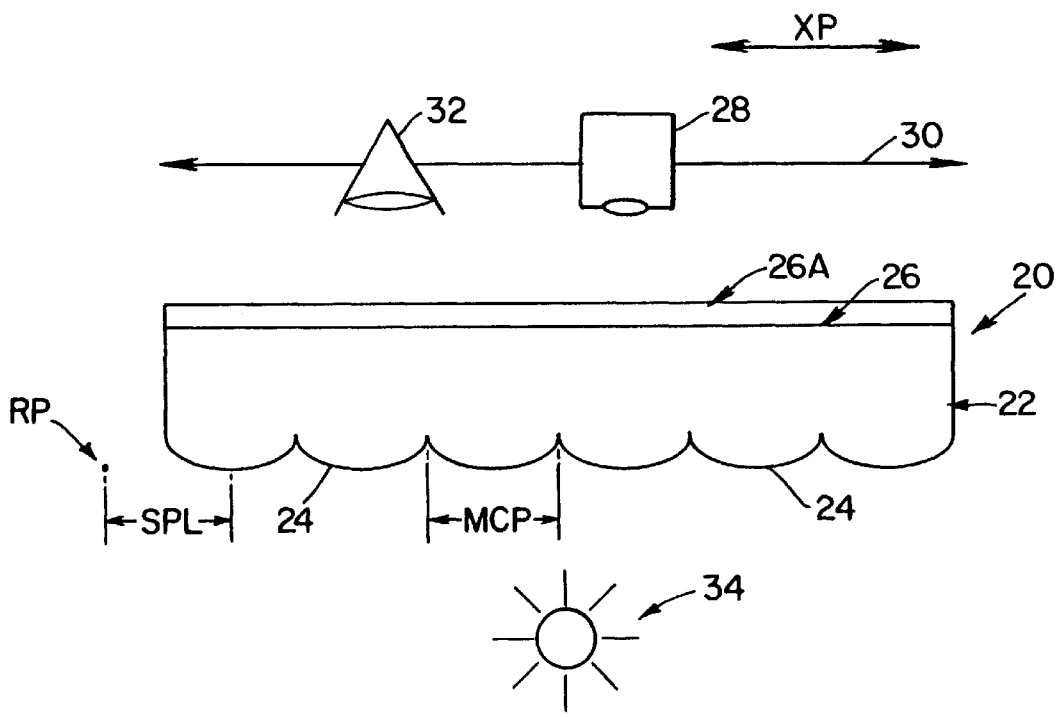
FIG. 1 depicts a lenticular sheet in relation to an inkjet printer head and light sensor movable along a carriage, for carrying out a method according to the present invention for printing on a lenticular sheet.

FIG. 1 shows a lenticular sheet, or foil 20, on which an image corresponding to the above-described image stored in the general purpose digital computer will be printed. The lenticular sheet may be formed according to any known extrusion method, and has a first side 22 having a plurality of optical elements, or lenticules 24, and a second side 26 having an ink receptive coating or surface 26A. The spacing between the lenticules is labeled MCP, and is assumed substantially uniform. The lenticular sheet 20 is shown inserted in a commercially available inkjet printer (not shown) having a print head 28 movable along a carriage 30. A light sensor 32 is mounted to the carriage 30, or to the print head 28, to move in the direction XP under control of the servo (not shown) by software instructions well known in the art. The light sensor has a digital output, in a standard computer interface format such as, for example, USB or FireWire. Sensors to use for item 32 can be any of the large variety of commercially available light sensors readily available from numerous vendors. An ambient light source, which may be room lights, is represented as 34. The distance labeled SPL represents the distance in the XP direction from a point, such as the crest (not labeled) of the left-most lenticule 24 to a reference point fixed relative to the printer and labeled RP.

A first method according invention, using the apparatus depicted in FIG. 1, begins by scanning the light sensor 32, at a rate SCAN, a distance in the XP direction sufficient to cross a plurality of the lenticules 24. As the light sensor moves it generates a sensor data (not shown) which is received by the general purpose programmable computer. As known to ones of ordinary skill in the art of digital signal processing, the digital sample output rate (not labeled), in samples-per-second, of the light sensor 32 is preferably at least ((2/MCP)×SCAN), where SCAN is in units of distance-per-second and MCP is in the same units of distance. Next, the general purpose programmable computer calculates the spacing MCP, or its inverse in terms of a spatial frequency of lenses-per-inch, for the lenticules 24 per inch, based on the data generated by the light sensor 32 during a scan. The computer also calculates the distance SPL, which is from the reference point RP to the left-most lenticule or microlens 24. As can be understood by one of ordinary skill in the relevant arts, the calculation is based on an amplitude modulation, or amplitude notches, exhibited by the output of the sensor 32 as the sensor moves in the XP direction across the lenticules 24. The modulation or notches exhibited by the sensor 32 signal are due to the periodic fluctuation in the thickness of the optical path length (not labeled) through the lenticular sheet 20 to the sensor 32. The calculation of MCP may use a Fourier transform, or the autocorrelation of the sensor 32 signal, or any other of the methods known to persons skilled in the art for estimating spacing or spatial frequency.

After calculating the frequency or the spacing MCP of the lenticules 24, and the distance SPL, the general purpose computer raster image processes ("rips") the image file representing the image to be printed on the lenticular sheet 20 and establishes, or modifies the pixel spacing to match the MCP spacing and SPL distance. For this first method, the entire image file is ripped, meaning that spacing for all of the pixels is determined based on a single scan across the lenticular sheet. Next, image file is transferred to the inkjet printer and printed on the ink-receptive surface 26A.

The method described above sets, or "rips", the pixel spacing for the entire image, or set of images, in the general purpose computer based on a single pass of the light sensor 32. Referring to FIG. 1 this assumes that the extending direction of the lenticules is sufficiently aligned, in terms of being perpendicular to the carriage direction XP, that the distance SPL, which is from the leftmost of the lenticules 24 to the reference point RP, remains constant as the lenticular sheet feeds through the printer. However, there may be instances where this alignment is not maintained. Causative factors likely include human error when inserting the lenticular sheet 20, as well as wear and misalignments within the printer.

The present inventors have identified a second method as a solution for this potential problem. The second method has the same initial steps as the first method, which are providing an inkjet printer having the light sensor 32, and a general purpose programmable computer having the rasterized images. The scanning and pixel spacing, though is performed periodically during the printing process. Instead of the entire set of pixels for all of the images being spaced in accordance with the first scan of the light sensor 32, only a subset of the pixel rows are ripped, or spaced and formatted for each scan. For example, after the first scan a spacing may be calculated for one row of each of rasterized images that are to be printed. The row is printed and then the scan step is repeated, a new set of MCP and SPL values are calculated, and another pixel row is ripped. The process repeats until the entire image is printed. A variation of this method prints a number (not labeled) of rows such as, for example, four, based on each scan. The specific number would be readily identifiable by one of ordinary skill, based on the degree of misalignment and the acceptable image quality.

In an example of this method, a Sherpa 43™ printer, commercially available from Agfa Gevaert N.V., Belgium, or any of the known equivalents, with a light sensor 32 mounted on its carriage (not shown, but corresponding to FIG. 1, item 30). An image file having two rasterized "flip" images is stored in a general purpose. The light sensor 32 was moved along the carriage in the XP direction and a value corresponding to the MPC distance is calculated. A small portion of two "flip" image files were then ripped or processed, in accordance with methods readily identified and implemented by one of skill in the relevant arts, to set the pixel spacing to match the calculated MPC distance. The small portions of the two image files, with the pixel spacing matched to the MPC distance, were then printed in a mirror configuration on the ink-receptive surface 26A. The light sensor 32 was scanned again to measure new values of MPC and SPL and a second small portion of the two images was printed. After printing, the lenticular foil 20 was observed from the side 22 having the lenses 24, and by changing the viewing angle the observer sees one and then the other of the two flip images. As a result of the spacing between the pixel or raster lines being matched to the lenticule spacing MCP, and the spacing SPL, the image quality was observed as being much better than can be generally attained with methods of the prior art.

Figure 2:
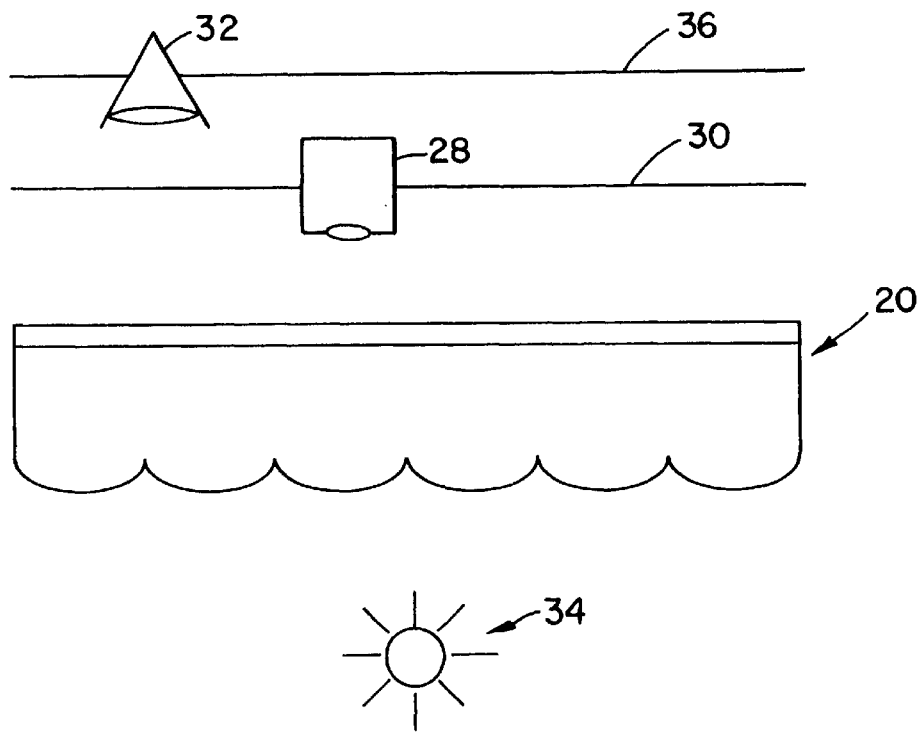
FIG. 2 depicts a lenticular sheet in relation to an inkjet printer head movable along a first carriage and a light sensor movable along a second carriage, as an example alternate structure for carrying out a method performed by the apparatus of FIG. 1.

FIG. 1 shows the light sensor 32 moving along the same carriage 30 as the printer head 28. FIG. 2 shows an alternative embodiment which mounts a light sensor, labeled as 32', to be movable along a second carriage 36.

Figure 3:
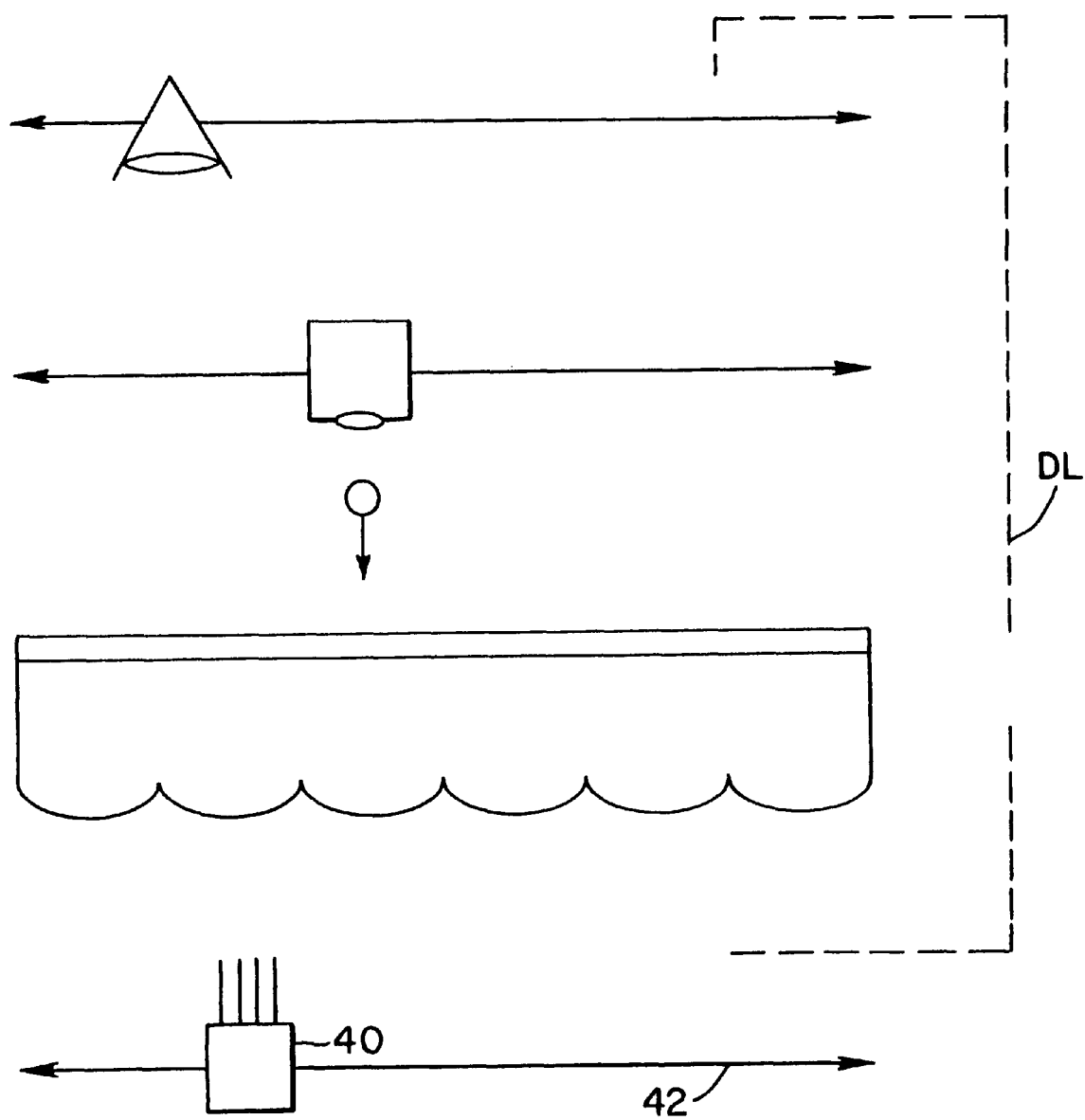
FIG. 3 depicts a lenticular sheet in relation to an inkjet printer head movable along a first carriage, a light sensor movable along a second carriage, and a light source cooperative with the light sensor, as an example alternate structure for carrying out a method performed by the apparatus of FIGS. 1 and 2.

The above examples described in reference to FIGS. 1 and 2 employed ambient light, labeled as item 34, to perform the MCP and SPL measurements. FIG. 3 shows another variation of the FIG. 2 apparatus, further including a light source 40 mounted to a third carriage mechanism, labeled as item 42. The light source 40 may be, for example, a compact laser, a power light emitting diode (LED), a halogen light, with or without additional lenses (not shown) to provide light through the lenticular sheet, or foil, incident from the side with the lenses 24. The dotted line DL represents the motion of the light source 40 being synchronous with, and aligned with, the motion of the light sensor 32.

It will be understood that FIGS. 1–3 are only examples of the aspects of this invention. Other structures and arrangements for moving a light sensor such as item 32, in the direction of an inkjet printer carriage, and for moving a light source such as item 40 with the light source, are contemplated by this invention, and will be readily identified by one of ordinary skill in the relevant arts upon reading this disclosure.

The above examples were described in reference to a lenticular foil 20 in general. A further aspect of this invention extrudes a lenticular foil to have a spacing between lenticules that matches, or corresponds to, measured characteristics of an inkjet printer identical to, or similar to, the one that the user practices the above-described methods on.

Numerically Describing Printer Resolution Frequencies

An example method according to this aspect of the invention starts with measuring the resolution frequency of at least one commercially available ink jet printer. Commercially available ink jet printers are of varying sizes, and have a range of specifications as to printing speed and resolution. The standard ratings for printer resolution are Lines Per Inch (LPI) or Dots Per Inch (DPI). Resolution is based on the inkjet printer having a placement grid of potential locations for depositing a drop or spot of ink, with the smallest granularity or minimum spacing of the grid being the smallest interval between placement of ink spots or droplets that the printer can realize, in the direction between adjacent grid lines. While larger intervals of placement may be possible, the least interval of placement in a direction has a minimum value determined by the construction of the selected printer. This parameter is measured and recorded, for purposes of this invention, as a Least Interval Value or Least Interval Value(i), where the index "i" may be used, if desired, to identify the particular model name or model number of the printer.

The Least Interval Value may be in accord with other published data of the printer, such as LPI or DPI. However, since the LPI and DPI of a printer may be nominal values that do not require exceptional precision, the Least Interval Value may vary from the LPI or DPI. Stated differently, two printers with the same published LPI or DPI may have different Least Interval values.

The Least Interval Value is determined by the design of the printer and the standards under which it is manufactured. The value typically is not subject to control by the end user. Further, the Least Interval Value normally does not substantially change over the typical useful life of the printer, provided the printer is maintained according to the manufacturer's recommendations.

The Least Interval Value may be a single value; preferably obtained as the best fit to test data obtained by measuring individual intervals performed by the printer. An average or mean may be used as an approximation of the best fit. The Least Interval Value may be a set of numbers including, for example, the average or mean, and a standard deviation, expressing regularized and consistent deviations of the print mechanism from the ideal step increment.

An example printer (not shown) for which the Least Interval Value is measured is the Sherpa 43™ printer, commercially available from Agfa Gevaert N.V., Belgium, or any of the known equivalents. An example determination of the Least Interval Value is carried out by issuing commands to the printer (not shown) causing its controller (not shown) to actuate its servos for the smallest possible movement of the print head. This numerically described smallest spacing interval is determined over the extent of the output according to the incremental positioning of the ink jet printer head. It is approximated by a single best fit value which specifies a numerical frequency having a substantial fit with the actual printer output which can deviate slightly but largely conforms to that numerical frequency in placing ink spots at the closest possible spacing on the receptive medium. Optionally, additional values that record consistent variance in the printer operation can be included in the Least Interval Data.

Customized Extrusion Tool Manufacture

It is known that a lenticular sheet may be formed by extrusion using an extrusion roll or cylinder, as described in the Background section of U.S. Pat. No. 5,362,351. A step in accordance with the present invention forms shows an extrusion cylinder (not shown) to have a spacing SL between adjacent grooves (not shown) that is based on the Least Interval Value. The extrusion cylinder is an extrusion cylinder of a type such as described in the Background section of U.S. Pat. No. 5,362,351 that is used for rolling plastic in an industrial forming process for lenticular sheets. It will be understood that except for the particular spacing SL, and its determination, that the general structure and materials of the cylinder 2 are known in the art.

The extrusion cylinder consists of a metal cylinder that has been inscribed with a plurality of grooves, the plurality being the inverted profile of the array of optical elements (such as item 14 of FIG. 1) that are to be formed by the extrusion of a transparent material.

The extrusion cylinder s formed as follows: A starting cylinder (not shown) from which the cylinder is formed is mounted on a lathe (not shown) and engraved with a diamond-tipped tool (not shown) that has the cutting profile of one lens element. The engraving step itself is known in the art. In the preferred embodiment the diamond-tipped tool is repositioned for multiple cuts into the cylinder at a fixed interval that is in accordance with the Least Interval Value measurements obtained from the selected printer.

The cutting interval, or spacing SL, is fixed at a value that is proportional to the printing interval PITV. The printing interval PITV is the pixel line-to-pixel line spacing that will be printed by the printer. The ratio between SL and PITV is a parameter that is determined on an application specific basis for each of the several kinds of view-dependent display contemplated as being manufactured using a lenticular sheet or foil according to this invention. A general guideline is that the ratio of cutting interval SL to printing interval PITV is 1.0 for applications using a very long viewing distance, and the cutting interval SL increases proportionately to a ratio greater than 1.0 times the printing interval as the viewing distance in the specific application is reduced. The cutting interval SL can be increased by scaling its value by an integer factor such that two or more of the Least Interval Values are combined to make a larger interval SL.

Extruded Material Formed According to Printer Least Interval Value

Figure 4:
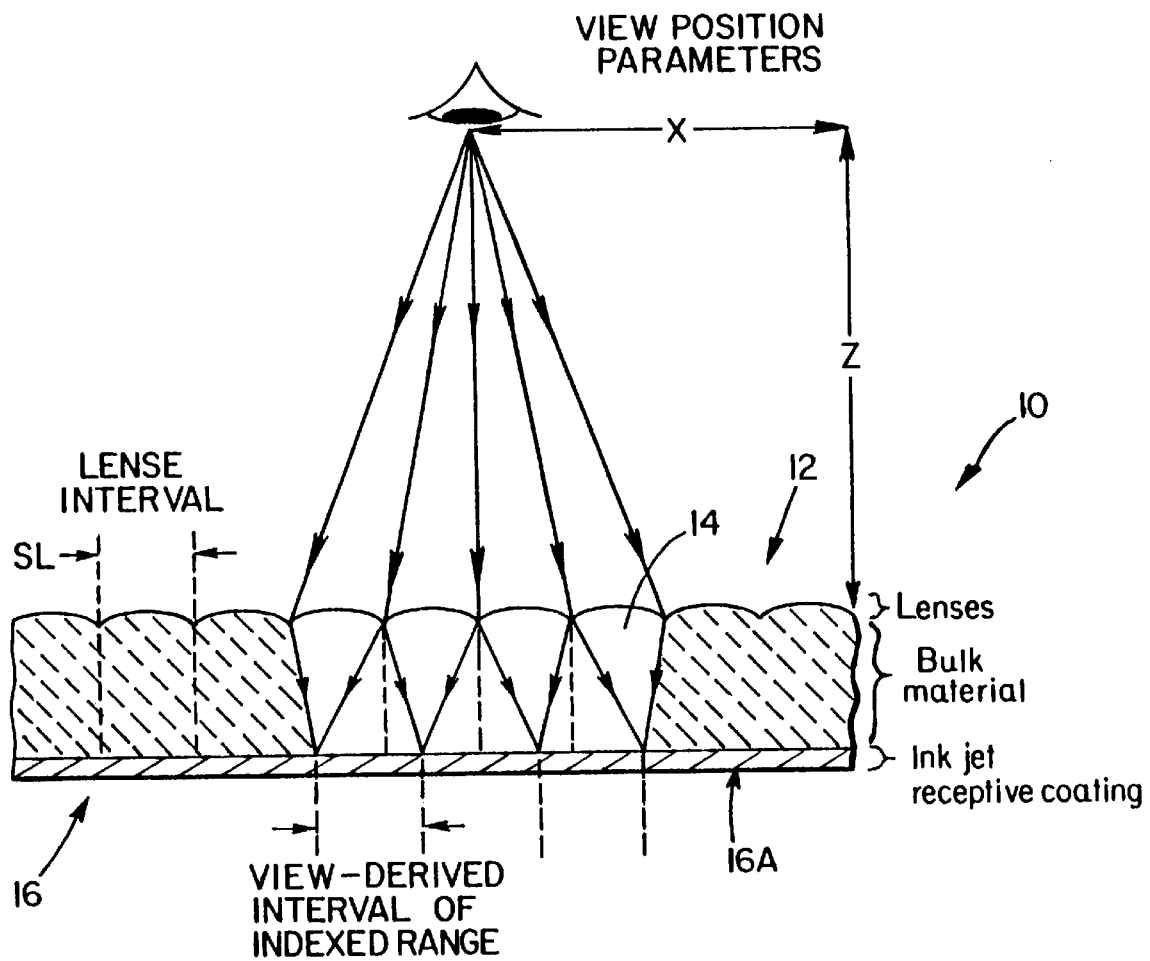
FIG. 4 illustrates a lenticular sheet made in accordance with another method according to this invention, for printing in accordance with the methods carried out by the apparati depicted in FIGS. 1–3.

FIG. 4 shows a lenticular sheet, or foil 10, formed according to this aspect of the present invention. The FIG. 4 lenticular foil for this example is formed by extrusion using the engraved cylinder described above. The extruded foil 10 has two sides, a first side 12 having a plurality of optical elements, or lenticules 14 and a second side 16 having an ink receptive coating or surface 16A. The plurality of optical elements, or lenticules 14 are spaced SL by the extrusion cylinder 2 and, accordingly, the spacing SL is based on the Least Interval Value frequency of a printer (not shown) selected to dispose ink on the surface 16A, with that Least Interval Value scaled by an application-specific parameter that determines optimal viewing distance and lens placement (SL) intervals.

The ink receptive coating 16A is preferably applied in a fabrication step separate from the extrusion step. An example step of depositing the ink-receptive coating is as follows: First, the following coating composition is prepared: in 960 g of water 21.8 g of gelatine and 16.0 g of polyvinylpyrrolidone (PVP K90) are dissolved at 36 degrees. To this solution 80 g of fine precipitated calcium-carbonate and 4 g of a polyacrylamide with a particle size of 20 micron is added and dispersed with a high-speed stirrer. Then nonionic and anionic surfactants are added to adjust the surface tension for good coating quality. The side 16 of the extruded material 10 opposite to the lenticules 14 is corona treated, and after this treatment the above-described example coating composition is applied at a wet coating weight of 130 g per square meter. After drying a matte white layer 16A with a total dry coating weight of 16 g per square meter is obtained.

In this example a gelatinous ink receptive coating 16A is applied to the back side 16 of a lenticular foil 10 using corona treatment for good adhesion. However, for those skilled in the art it will be understood that other kinds of substrate material can be used, provided that the lens structures 14 can be made in them, in combination with a subbing layer (not shown) that is applied to the back side, such as the side labeled as 16 in FIG. 4. Further, upon this subbing layer any ink receptive layer known in the art can be applied, i.e. polymeric binder layers comprising gelatines, polyvinylalcohols, polyvinylpyrrolidones, polyamines, polyethyleneamines, celluloses, and the like, and microporous layers comprising pigment particles such as silicas, $TiO_2$, aluminas and the like, and any combination of said layer structures.

The ink-receptive coating can be a single coating layer, such as 16A in FIG. 4, or it can comprise many different layer compositions applied to the substrate in a single pass or in multiple passes. Further, the ink receptive coatings can be applied to the lenticular foils in a separate fabrication step, as described in the example above, but this is not a limitation. For example, the ink-receptive layer or coating such as that shown as item 16A in FIG. 4 can be applied to the polymeric material in an inline coating step, or an inline coextrusion step.

Extruded Material Printed by Printer Having Similar Lest Interval Value

For this example the previously identified Sherpa 43™ printer, commercially available from Agfa Gevaert N.V., Belgium, or any of the known equivalents, was used to print the two rasterized "flip" images in a mirror configuration on the ink-receptive surface 16A. The Sherpa 43™ printer was used to obtain the SL value. Therefore, the SL spacing between the lenticules 14 and the associated spacing between the printed pixel or raster lines matched the Least Interval Value of the Sherpa 43™ printer. Referring to FIG. 1, the printing was carried out by moving the light sensor 32 along the carriage in the XP direction and a value corresponding to the MPC distance is calculated. A small portion of two "flip" image files were then ripped or processed, in accordance with methods readily identified and implemented by one of skill in the relevant arts, to set the pixel spacing to match the calculated MPC distance. The small portions of the two image files, with the pixel spacing matched to the MPC distance, were then printed in a mirror configuration on the ink-receptive surface 26A. The light sensor 32 was scanned again to measure new values of MPC and SPL and a second small portion of the two images was printed. After printing, the lenticular foil 10 was observed from the side 12 having the lenses 14, and by changing the viewing angle the observer sees one and then the other of the two flip images. As a result of the spacing between the pixel or raster lines, and the microlens spacing SL being associated with the Sherpa 43 or equivalent printer, and the steps of scanning the light sensor across the lenticules to measure the spacing MCP and SPL values, the image was of high quality.

It is contemplated that one or more kinds or model numbers of inkjet printers will have their Least Interval Value date measured and identified as sufficiently similar such that a single spacing SL can be used for any of such printers. In this case the lenticular sheet such as that shown in FIG. 4 could be sold with a list of printer identifiers for which the sheet would be compatible.

Instead of "flip" images the input to the general purpose programmable computer (not shown) could be three viewing angles of a scene for three-dimensional display through a lenticular sheet. As known in the art, each viewing angle comprises stereo images, namely a left image and a right image. As also known in the art, the left and right images need not be from pre-existing pictures. Instead, a "left" and "right" image could be created from a single picture, by selecting pixel regions within the picture and shifting the region to simulate the parallax that between an actual left and right picture. Further, as also known in the art, images of multiple objects could be retrieved from the computer storage (not shown), or input to the computer, and then merged into artificial scenes. It is further assumed that the one or more stereo images input to the computer, or generated by pixel-shifting, are rasterized into a plurality of pixel lines or strips, or raster lines (not shown).

The present invention has been described in terms of several preferred embodiments. However, various obvious additions and changes to the preferred embodiments are likely to become apparent to persons skilled in the art upon a reading and understanding of the foregoing specification. Further, it will be understood that the specific structure, form and arrangement of parts depicted and described are for purposes of example only, and are not intended to limit the scope of alternative structures and arrangements contemplated by this invention. Instead, the depicted examples are to assist persons of ordinary skill in understanding the principles, features and practical considerations of this invention and, based on the example and other descriptions herein, make and use it and any of its alternative embodiments that will be obvious upon reading this disclosure.

We claim:

1. A method for printing an image on a lenticular sheet, comprising steps of:

storing a pixel-based image;

providing an inkjet printer having a print head movable in a carriage direction and a light sensor for sensing light at a plurality of positions along the carriage direction;

providing a lenticular sheet, formed of a substantially transparent material, having a plurality of lenticules, each extending in a lens extending direction, and having an ink-receptive surface;

placing the lenticular sheet into a cooperative arrangement with the inkjet pruner such that the lens extending direction extends substantially normal to the carriage direction;

(a) sensing a light passing through the lenticular sheet at a plurality of positions along the carriage direction and generating a light sensing data in response, said light being at least an ambient light;

(b) calculating a lenticule data based on at least the light sensing data, the lenticule data including at least a lenticule frequency data representing a frequency of lenticules per unit length of the lenticular sheet;

(c) generating a lenticule-adjusted raster image file representing a plurality of raster lines based on at least a portion of the pixel-based image and having a raster line spacing based on said lenticule frequency data; and (d) printing the lenticule-adjusted raster image file on the lenticular sheet.

2. A method according to claim 1, wherein said step of providing an inkjet printer provides an inkjet printer further including a light source movable in the carriage direction; and said step (a) of sensing a light passing through the lenticular sheet at a plurality of positions along the carriage direction and generating a light sensing data in response includes moving the light source synchronously with the light sensor, and the light further includes light generated by the light source.

3. A method according to claim 1 further including steps of:

(e) moving the lenticular sheet a predetermined amount in the lenticule-extending direction;

(f) repeating steps (a) through (d); and (g) repeating steps (e) and (f) until a predetermined image completion condition occurs.

4. A method according to claim 2 further including steps of:

(e) moving the lenticular sheet a predetermined amount in the lenticule-extending direction;

(f) repeating steps (a) through (d); and (g) repeating steps (e) and (f) until a predetermined image completion condition occurs.

5. A method according to claim 1, wherein said lenticule data further includes an alignment data representing a distance, in the carriage direction, between a reference point fixed relative to movement of the inkjet printer's print head and at least one of the lenticules of the lenticular sheet.

6. A method according to claim 5 further including steps of:

(e) moving the lenticular sheet a predetermined amount in the lenticule-extending direction;

(f) repeating steps (a) through (d); and (g) repeating steps (e) and (f) until a predetermined image completion condition occurs.

7. A method according to claim 2, wherein said lenticule data further includes an alignment data representing a distance, in the carriage direction, between a reference point fixed relative to movement of the inkjet printer's print head and at least one of the lenticules of the lenticular sheet.

8. A method according to claim 7 further including steps of:

(e) moving the lenticular sheet a predetermined amount in the lenticule-extending direction;

(f) repeating steps (a) through (d); and (g) repeating steps (e) and (f) until a predetermined image completion condition occurs.

9. A method according to claim 1, wherein said step of providing a lerticular sheet comprises steps of:

providing an inkjet printer having a digital signal interface for communicating with a programmable processor and having a movable print head selectively moved by a servo in response to externally generated commands received through the digital signal inbrface;

measuring the smallest increment that the servo can move the movable print head;

generating a least increment data representing the smallest increment measured by the measuring step; and extruding a lenticular sheet having a plurality of parallel lenticules with a spacing between adjacent ones of said plurality of lenticules based on the least increment data.

10. A method for displaying images through a lenticular sheet comprising steps of:

providing an inkjet printer having a digital signal interface for communicating with a programmable processor and having a movable print head selectively moved by a servo in response to externally generated commands received through the digital signal interface;

measuring the smallest increment that the servo can move the movable print head;

generating a least increment data representing the smallest increment masured by the measuring step;

extruding a lenticular sheet having a plurality of parallel lenticules with a spacing between adjacent ones of said plurality of lenticules based on the least increment data;

forming an ink-receptive surface on said lenticular sheet;

providing a printer having a smallest increment measurement within a predetermined range of said least increment data the inkjet printer having a print head movable in a carriage direction and a light sensor for sensing light at a plurality of positions along the carriage direction;

storing a pixel-based image;

placing the lenticular sheet into a cooperative arrangement with the inkjet printer such that the lenticules extend in an extending direction substantially normal to the carriage direction;

(a) sensing a light passing through the lenticular sheet at a plurality of positions along the carriage direction and generating a light sensing data in response, said light being at least an ambient light;

(b) calculating a lenticule data based on at least the light sensing data, the lenticule data including at least a lenticule frequency data representing a frequency of lenticules per unit length of the lenticular sheet;

(c) generating a lenticule-adjusted image portion, based on at least a portion of the pixel-based image and lenticule frequency data; and (d) printing the lenticule-adjusted image portion on the lenticular sheet.

* * * * *